United States Patent
Kamo

(10) Patent No.: US 8,603,707 B2
(45) Date of Patent: Dec. 10, 2013

(54) EXPOSURE METHOD AND EXPOSURE MASK

(75) Inventor: Takashi Kamo, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 102 days.

(21) Appl. No.: 13/422,530

(22) Filed: Mar. 16, 2012

(65) Prior Publication Data

US 2013/0059234 A1 Mar. 7, 2013

(30) Foreign Application Priority Data

Sep. 2, 2011 (JP) ................................. 2011-191793

(51) Int. Cl.
*G03F 1/72* (2012.01)
*G03F 1/24* (2012.01)

(52) U.S. Cl.
USPC .............................................. 430/5; 430/394

(58) Field of Classification Search
USPC .......................... 430/5, 322, 325, 394; 378/35
See application file for complete search history.

(56) References Cited

U.S. PATENT DOCUMENTS

2006/0093924 A1* 5/2006 Adkisson et al. ................. 430/5

FOREIGN PATENT DOCUMENTS

| JP | 2001-250756 | 9/2001 |
| JP | 2002-141275 | 5/2002 |

OTHER PUBLICATIONS

C. Clifford et al., "Compensation methods for buried defects in extreme ultraviolet lithography masks", Proc. of SPIE, vol. 7636, pp. 1-8 (2010).

* cited by examiner

*Primary Examiner* — Stephen Rosasco
(74) *Attorney, Agent, or Firm* — Finnegan, Henderson, Farabow, Garrett & Dunner, LLP

(57) ABSTRACT

According to one embodiment, an exposure method comprises exposing a desired pattern on a sample by use of a first reflection type mask on which the desired pattern to be exposed on the sample is formed and a defect is partially formed, and exposing a correction pattern on the sample by use of a second reflection type mask having the correction pattern of a reflection film formed at a position corresponding to the defect of the first reflection type mask.

17 Claims, 6 Drawing Sheets

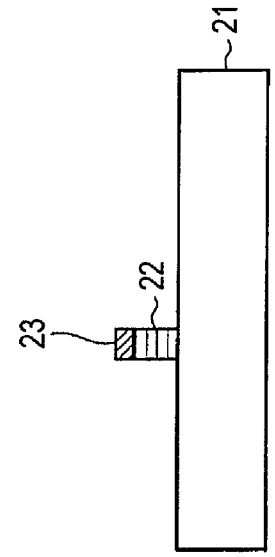
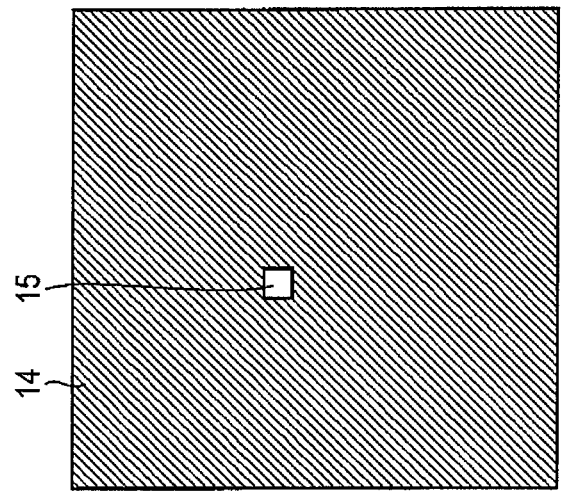
FIG. 3A
FIG. 3B
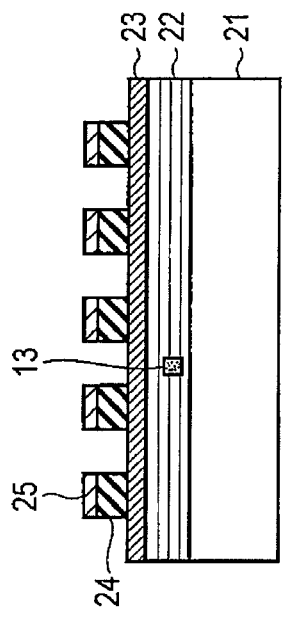
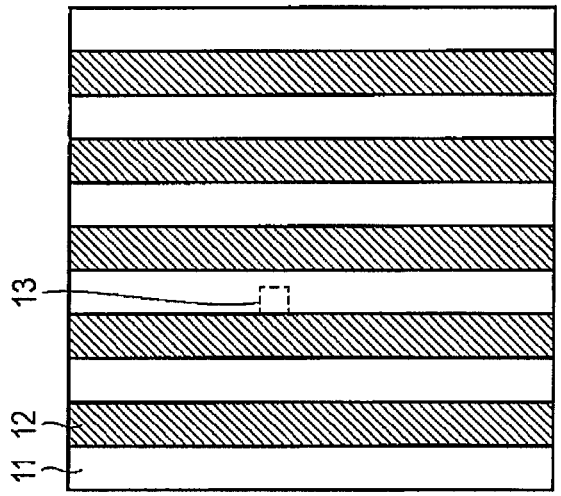
FIG. 2A
FIG. 2B

EXPOSURE METHOD AND EXPOSURE MASK

CROSS-REFERENCE TO RELATED APPLICATIONS

This application is based upon and claims the benefit of priority from prior Japanese Patent Application No. 2011-191793, filed Sep. 2, 2011, the entire contents of which are incorporated herein by reference.

FIELD

Embodiments described herein relate generally to an exposure method for exposing a desired pattern on a sample such as a wafer or the like and an exposure mask used for this method.

BACKGROUND

A multi-layered film defect may form as a defect inherent to a reflection type mask (EUV exposure mask) used for exposure when using extreme ultraviolet rays (EUV rays). The multi-layered film defect occurs due to a pit or bump on a substrate or foreign matter attached onto the substrate before formation of the multi-layered film or during formation of the film. If the above foreign matter is present, the uniform arrangement of the multi-layered film is disturbed to cause a phase difference with respect to a normal portion. That is, a so-called topological defect occurs.

It is difficult to correct the multi-layered film itself when the topological defect is corrected. Therefore, it is proposed to correct an absorber pattern in order to correctly transfer a pattern. However, in the case of a large topological defect, it is impossible to make a mask correction to correctly transfer the pattern on the wafer simply by correcting the absorber pattern. In this case, it is necessary to attempt to form a non-defective mask again. However, mask reformation is not realistic in many cases in view of the cost and TAT (Turn Around Time).

Further, a method is provided for utilizing the fact that there is substantially no possibility that a defect is present on a first mask and a defect occurs in the same portion of a second mask and transferring a pattern by use of the two masks with the same pattern at the wafer exposure time. Also, a method for arranging a plurality of chips in the same mask and performing double exposure is provided. However, with the above methods, it is necessary to form the same mask or the same chip pattern and the cost for mask formation rises. Additionally, it is predicted that a portion having no defect and formed in a pattern form by double exposure and a portion formed in a pattern form by single exposure because of the presence of a defect in any mask or chip pattern will differ in the transfer pattern dimension.

BRIEF DESCRIPTION OF THE DRAWINGS

FIGS. 2A, 2B are a plan view and cross-sectional view showing the schematic structure of a first mask used in the exposure method according to the first embodiment.

FIGS. 3A, 3B are a plan view and cross-sectional view showing the schematic structure of a second mask used in the exposure method according to the first embodiment.

DETAILED DESCRIPTION

In general, according to one embodiment, an exposure method comprises exposing a desired pattern on a sample by use of a first reflection type mask on which the desired pattern to be exposed on the sample is formed and a defect is partially formed, and exposing a correction pattern on the sample by use of a second reflection type mask having the correction pattern of a reflection film formed at a position corresponding to the defect of the first reflection type mask.

Exposure methods of embodiments are explained below with reference to the drawings.

First Embodiment

Figure 1A:
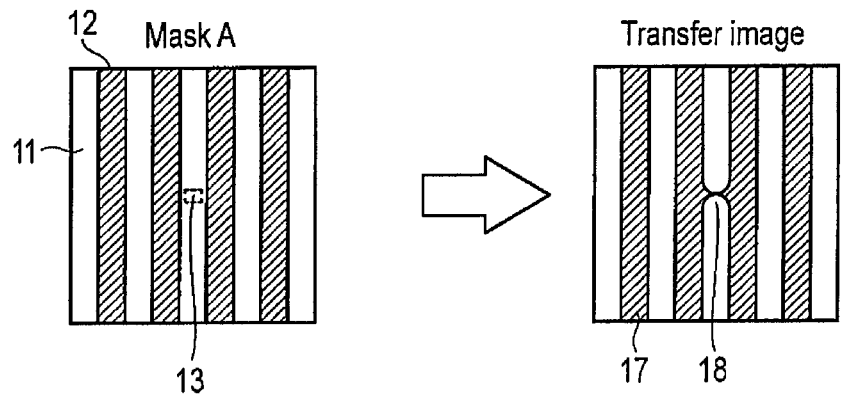
FIGS. 1A, 1B are schematic views for illustrating the basic principle of an exposure method according to a first embodiment.
Figure 1B:
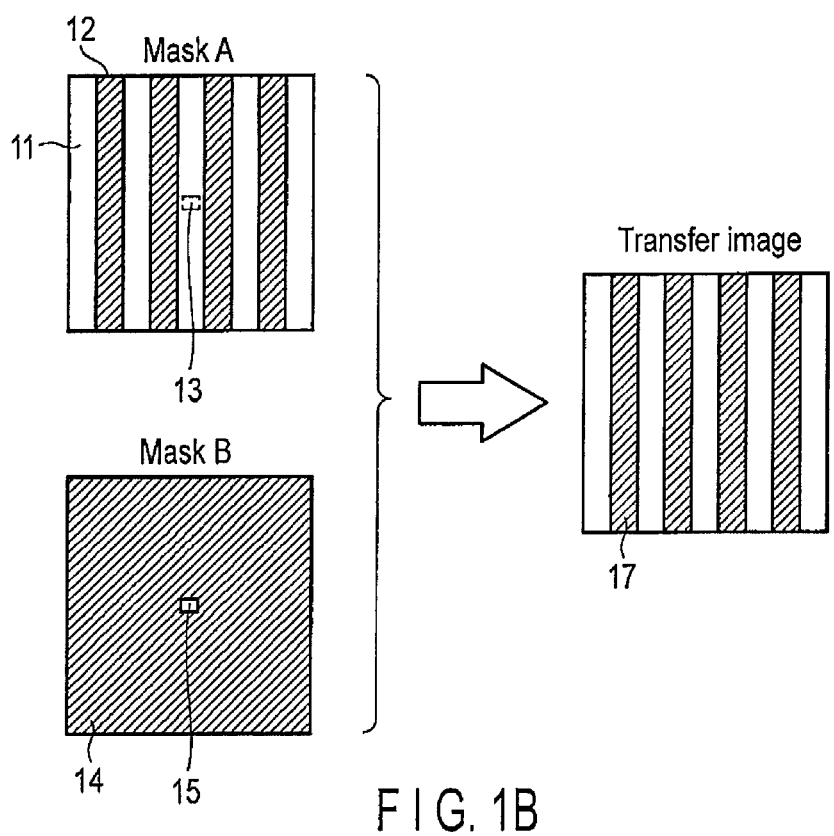

FIGS. 1A, 1B are schematic views for illustrating the basic principle of an exposure method according to a first embodiment. FIG. 1A shows a wafer transfer impact when a topological defect is present and FIG. 1B shows wafer transfer loss due to a luminescent-spot pattern mask. Further, 11 in the drawing denotes a multi-layered film reflection pattern, 12 an absorber pattern, 13 a multi-layered film defect (topological defect), 14 a shielding region, 15 a multi-layered film pattern, 17 a transfer pattern on the wafer, and 18 a pattern defect on the wafer.

When a defect (topological defect) 13 is present on the multi-layered film of reflection type exposure mask A as shown on the left side of FIG. 1A, a so-called black-series defect 18 that is a pattern defect occurs on the transfer pattern 17 on the wafer as shown on the right side of FIG. 1A. Therefore, in this embodiment, mask B having a multi-layered film pattern 15 formed only in a portion in which the defect of mask A is present is formed for mask A having the topological defect 13 formed thereon as shown on the left side of FIG. 1B. Then, double patterning is performed on the wafer by use of a positive resist. As a result, the black-series defect 18 on the wafer can be removed as shown on the right side of FIG. 1B and the number of defects on the transfer pattern can be reduced.

The exposure method using the above principle is explained in more detail.

FIGS. 2A, 2B show the structure of first exposure mask A (first reflection type mask) on which a topological defect is present in the mask pattern, FIG. 2A is a plan view and FIG. 2B is a cross-sectional view. FIGS. 3A, 3B show the structure of a second exposure mask B (second reflection type mask), FIG. 3A is a plan view and FIG. 3B is a cross-sectional view.

As shown in FIGS. 2A, 2B, mask A is an EUV exposure mask formed of reflection type mask blanks including a reflection multi-layered film 22, protection film 23, absorber 24 and low-reflectance layer 25 (that is hereinafter referred to as an LR layer) on a low thermal expansion rate substrate (mask substrate) 21. A topological defect 13 caused by a multi-layered film defect is present in a mask pattern of mask A. The reflection multi-layered film 22 is formed of a laminated layer of approximately 40 pairs of Mo/Si to reflect exposure light. The protection layer 23 is Ru and is formed on the reflection multi-layered film 22. The absorber 24 is formed of TaBN that absorbs exposure light and formed on the protection layer 23. The low-reflectance layer 25 is formed on the absorber 24 and is used to check a mask defect. The topological defect 13 is present in the multi-layered film 22.

As shown in FIGS. 3A, 3B, mask B is formed of the same mask blanks as those described above. A shielding region 14 of mask B is formed by removing the multi-layered film 22. That is, in the exposure region of mask B, a multi-layered film pattern 15 in which the multi-layered film 22 is present only in a region corresponding to a topological defect portion of mask A is formed.

Next, the exposure method using masks A, B is explained with reference to FIGS. 4A to 4D.

Figure 4A:
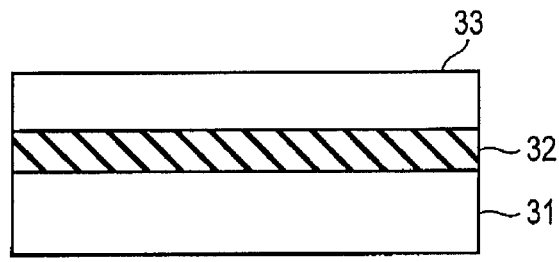
FIGS. 4A to 4D are cross-sectional views of steps for illustrating the exposure method according to the first embodiment.
Figure 4B:
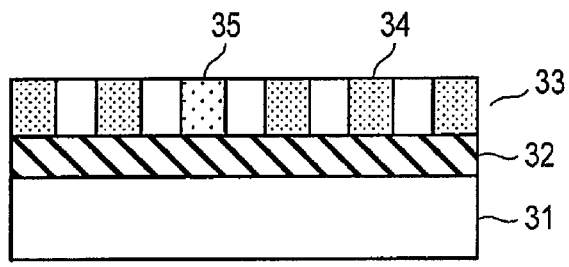

First, as shown in FIG. 4A, a wafer formed by forming an oxide film 32 on a Si substrate 31 and coating positive resist 33 thereon is prepared. If the wafer is exposed by use of mask A, the pattern of mask A is exposed as shown in FIG. 4B (a hatched portion 34 in the drawing is the exposure region). At this time, a defect is transferred to a wafer portion 35 corresponding to a location at which the topological defect 13 of mask A is present. That is, since the exposure amount in a portion corresponding to the defect becomes less, the pattern may become thick or a short circuit may occur if the development process is performed as it is.

Figure 4C:
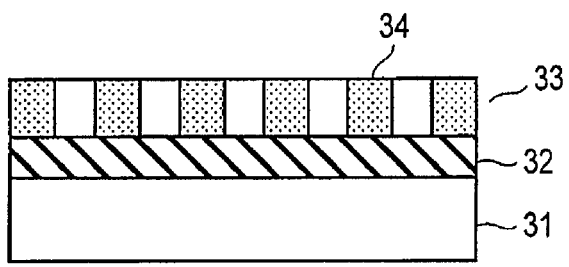
Figure 4D:
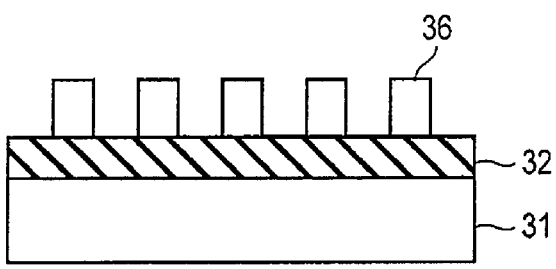

Next, if the wafer is exposed by use of mask B, an underexposure portion occurring due to the topological defect 13 of mask A is eliminated as shown in FIG. 4C. Then, the defect on the wafer caused by the topological defect of mask A can be eliminated as shown in FIG. 4D by performing the development process, and as a result, a preferable resist pattern 36 can be obtained.

In this embodiment, exposure is made by use of mask A including a main chip pattern in a first exposure cycle and exposure is made by use of mask B to eliminate the defect in a second exposure cycle. However, the process is not limited to this case and the exposure order of masks A, B can be reversed.

Further, in this embodiment, the second exposure cycle is sequentially made following after the first exposure cycle, but the second exposure-development cycle may be sequentially made following after the first exposure-development cycle. Further, a process is performed until the oxide film 32 is etched after the first exposure-development cycle, then resist may be coated again and a second cycle of exposure-development-etching process of the oxide film 32 may be performed.

In this embodiment, an example of resist patterning for processing the oxide film 32 on the Si substrate 31 is explained, but this can be similarly applied to resist patterning for another film structure process. Further, in this embodiment, a mask formed by removing the multi-layered film is used as the shielding region, but a mask in which the shielding region is formed by thickening the film of the absorber or forming the same in a laminated form may be used.

Thus, in this embodiment, second reflection type mask B on which a multi-layered film pattern 15 is formed only in a portion corresponding to a portion in which the defect of mask A is present is formed with respect to first reflection type mask A on which a topological defect is present and double patterning is performed by use of masks A, B. As a result, even in the case of a large topological defect that cannot be corrected by processing only the absorber in the conventional case, the defect on the wafer can be eliminated and the dimension of the main pattern can be precisely controlled. In this case, since substantially no fine pattern is formed on second mask B, an increase in the cost and time required for formation of mask B can be significantly suppressed.

Therefore, the defect on the wafer can be eliminated even if a topological defect or the like is present on the multi-layered film of the mask while significantly suppressing an increase in the cost and time required for formation of the mask. As a result, the precision of the pattern dimension can be enhanced.

Second Embodiment

Figure 5:
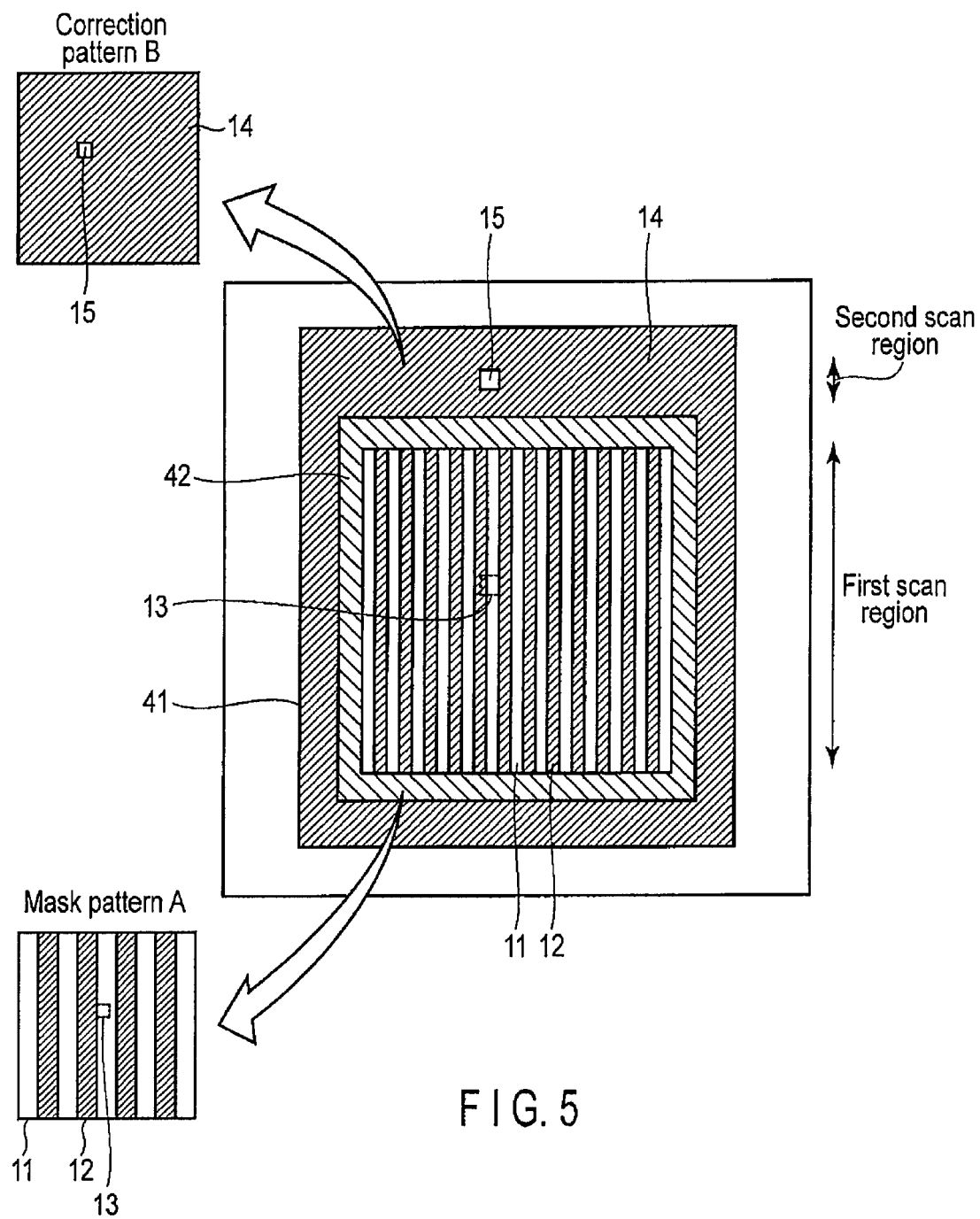
FIG. 5 is a plan view showing the schematic structures of a mask used in an exposure method according to a second embodiment.

FIG. 5 is a plan view showing the schematic structure of a reflection type exposure mask used in an exposure method according to a second embodiment. In the drawing, the same symbols are attached to the same portions as those of FIG. 2A and FIG. 3A and the detailed explanation thereof is omitted.

Like mask A of the first embodiment, the mask of this embodiment is an EUV exposure mask formed of reflection type mask blanks. It is supposed that a topological defect caused by a multi-layered film defect is present in a pattern of a chip region. Further, it is supposed that a multi-layered film region is present only in a portion that lies inside the maximum exposure region and outside the shielding band region and whose coordinate is the same as that of the topological defect in the vertical direction with respect to the exposure scan direction.

Thus, the mask of this embodiment is formed by use of the same mask blanks as those in the first embodiment and the patterns of mask A and mask B are formed on the same substrate.

Mask pattern A that is the same as mask A is formed in the maximum exposure region 41 on the mask substrate and correction pattern B that is the same as mask B is formed in a region inside the maximum exposure region 41 and outside the forming region of mask pattern A. The surrounding portion of a region in which mask pattern A is formed acts as a shielding band region 42 and correction pattern B is formed outside (on the upper side of) the above region. Pattern A is exposed in a first scan process by moving a mask stage (not shown) having the mask placed thereon or a wafer stage (not shown) having the wafer placed thereon and pattern B is exposed in a second scan process.

The exposure method using the mask of this embodiment is basically performed as described with reference to FIGS. 4A to 4D.

First, if first exposure of a scan region is made by use of the mask of this embodiment with respect to a wafer shown in FIG. 4A, first pattern A is exposed and, at the same time, a defect is transferred to a wafer portion corresponding to a portion in which a topological defect is present as shown in FIG. 4B.

Then, if second exposure of the scan region is made with respect to the wafer, an underexposure portion caused by a topological defect 13 of first pattern A is eliminated as shown in FIG. 4C. Next, a development process is performed to eliminate the defect on the wafer caused by the topological defect of pattern A and acquire a preferable pattern as shown in FIG. 4D.

In this embodiment, exposure of the region including the main chip pattern is made in the first exposure cycle and exposure of the region to eliminate the defect is made in the second exposure cycle. However, the process is not limited to the above case and the order of the exposure scan regions can be reversed.

Further, in this embodiment, the second exposure cycle is sequentially made following after the first exposure cycle, but the second exposure-development cycle may be sequentially made following after the first exposure-development cycle. Further, an etching process may be performed for an oxide film 32 after the first exposure-development cycle, then a resist may be coated again and a second cycle of an exposure-development-etching process of the oxide film 32 may be performed.

Like the first embodiment, in this embodiment, the process is not limited to the process for the oxide film 32 on the Si substrate 31 and can be applied to a resist patterning process for another film structure process. Further, the shielding region is not necessarily formed by eliminating the multi-layered film, and the shielding region may be formed by thickening the film of the absorber or forming the same in a laminated form.

Thus, in this embodiment, double patterning is performed for patterns A, B by use of a mask including pattern A on which a main pattern is formed and pattern B on which a correction pattern 15 is formed. As a result, like the first embodiment, the defect on the wafer can be eliminated even if a topological defect or the like of the multi-layered film of the mask is present and the pattern dimensional precision can be enhanced. Additionally, the mask itself can be acquired merely by providing the pattern of mask B outside normal mask A. Therefore, an advantage that an increase in the cost and time required for mask formation can be extremely suppressed can be attained.

Third Embodiment

Figure 6A:
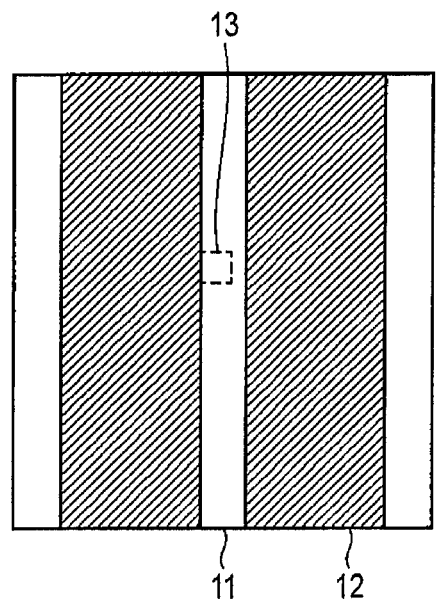
FIGS. 6A, 6B are plan views showing the schematic structure of a mask used in an exposure method according to a third embodiment.
Figure 6B:
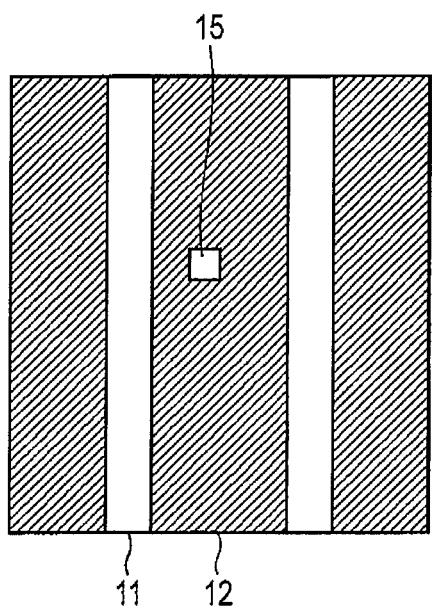

FIGS. 6A, 6B show mask A having a multi-layered film (topological) defect formed in a mask pattern and mask B for correction exposure. In the drawing, the same symbols are attached to the same portions as those of FIG. 2A and FIG. 3A and the detailed explanation thereof is omitted.

As shown in FIG. 6A, mask A is an EUV exposure mask formed of reflection type mask blanks used in the first embodiment and a topological defect 13 caused by the multi-layered film defect is present in a mask pattern. A multi-layered film reflection pattern 11 is obtained by thinning every other pattern to be formed on the wafer, and therefore, the pattern pitch of mask A of this embodiment becomes twice that of mask A used in the first embodiment. Like the case of FIGS. 2A, 2B, the multi-layered film reflection pattern 11 is formed of opening portions of an absorber 24 formed on the multi-layered film 22. That is, the pattern is an inverted pattern of an absorber pattern 12.

As shown in FIG. 6B, mask B is an EUV exposure mask formed of reflection type mask blanks used in the first embodiment and is obtained by thinning every other pattern that is to be formed on the wafer and is different from that of mask A of FIG. 6A. Further, on mask B, a multi-layered film pattern 15 is formed in a region corresponding to a portion of the topological defect of mask A. The multi-layered film pattern 15 is formed of opening portions of the absorber pattern 12.

Next, the exposure method using masks A, B is explained with reference to FIGS. 7A to 7D. In the drawing, the same symbols are attached to the same portions as those of FIG. 4A to 4D and the detailed explanation thereof is omitted.

Figure 7A:
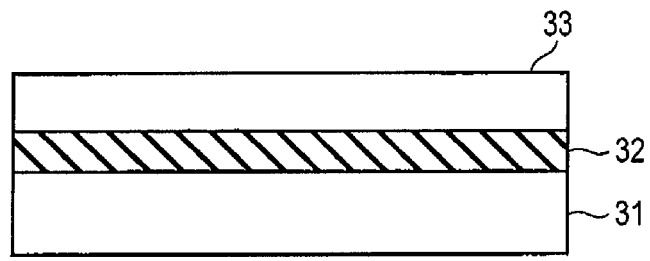
FIGS. 7A to 7D are cross-sectional views of steps for illustrating the exposure method according to the third embodiment.
Figure 7B:
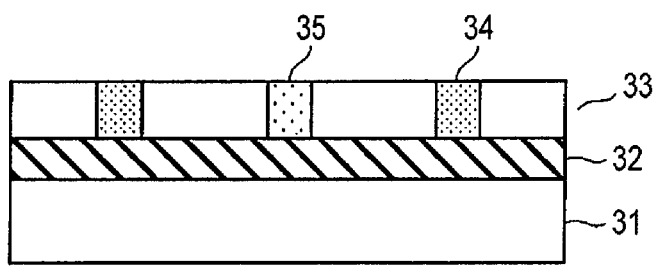

First, as shown in FIG. 7A, a wafer obtained by forming an oxide film 32 on a Si substrate 31 and then coating positive resist 33 on the structure is prepared. If exposure is performed for the wafer by use of mask A, a pattern of mask A is exposed as shown in FIG. 7B (a hatched portion 34 is an exposure region in the drawing). At this time, a defect is transferred to a wafer portion 35 corresponding to a position where a topological defect of a multi-layered film is present. That is, the exposure amount of a portion corresponding to the defect becomes less and the pattern may become thick or a short circuit may occur if the development process is performed as it is.

Figure 7C:
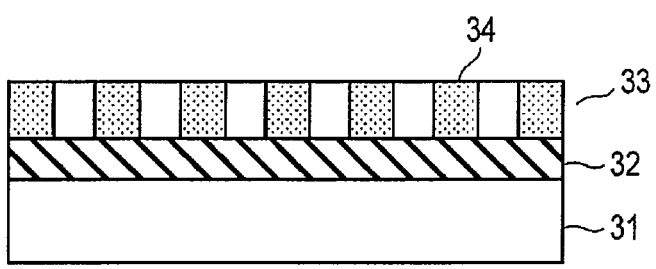
Figure 7D:
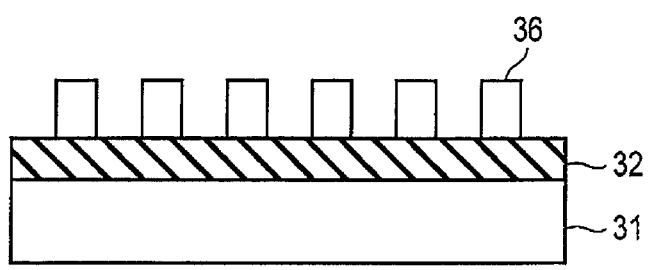

Next, if exposure is made for the wafer by use of mask B, the pattern of mask B is exposed as shown in FIG. 7C and the underexposure portion caused by the topological defect of mask A is eliminated. Then, a pattern 36 on which the patterns of masks A, B are reflected by performing the development process is formed as shown in FIG. 7D. At the same time, a resist of a wafer defect portion caused by the multi-layered film (topological) defect of mask A is removed and a common defect caused by the mask can be eliminated.

Also, in this embodiment, like the first embodiment, the exposure order of masks A, B can be reversed. Further, the second exposure-development cycle may be sequentially made following after the first exposure-development cycle. Further, an etching process may be performed for the oxide film 32 after the first exposure-development cycle, then the resist may be coated again and a second cycle of an exposure-development-etching process of the oxide film 32 may be performed. Further, the process is not limited to a resist patterning process for an oxide film process on the Si substrate 31 and can be similarly applied to a resist patterning process for another film structure process.

Thus, in this embodiment, two masks A, B formed by separating a normal pattern into halves are used and double patterning is performed for patterns A, B. Therefore, like the first embodiment, the defect on the wafer can be eliminated even if a topological defect or the like of the multi-layered film of mask A is present. As a result, the pattern dimensional precision can be enhanced.

This embodiment is applied to a method using two masks by double patterning. Since a luminescent-spot pattern is added to the coordinate of mask B corresponding to a topological defect portion present on mask A, there occurs substantially no increase in the cost and time required for the added process by using this method.

(Modification)

This invention is not limited to the above embodiments. In the embodiments, an example of the EUV exposure mask is explained as the mask, but the mask is not necessarily limited to the EUV exposure mask and can be applied to any mask if the mask is a reflection type mask. Further, the multi-layered film, absorber and other materials configuring the mask are not limited to those explained in the embodiments and can be properly modified.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An exposure method comprising:
exposing a desired pattern on a sample by use of a first reflection type mask on which the desired pattern to be exposed on the sample is formed and a defect is partially formed, and exposing a correction pattern on the sample by use of a second reflection type mask having the correction pattern of a reflection film formed at a position corresponding to the defect of the first reflection type mask.

2. The exposure method of claim 1, wherein the first reflection type mask is formed by forming a pattern of an absorber film on a reflection multi-layered film after the multi-layered film is formed on a substrate and the second reflection type mask is formed by forming a pattern of a multi-layered film at a position corresponding to a defect of the first reflection type mask.

3. The exposure method of claim 2, wherein the defect is a topological defect formed in the reflection multi-layered film.

4. The exposure method of claim 2, wherein the second reflection type mask is formed by removing a multi-layered film other than that at a position corresponding to the defect of the first reflection type mask after the reflection multi-layered film is formed on a substrate.

5. The exposure method of claim 1, wherein the first and second reflection type masks are formed on the same substrate.

6. The exposure method of claim 5, wherein a shield region is formed around the first reflection type mask and the second reflection type mask is formed in an exposure region of the substrate and outside the shield region.

7. The exposure method of claim 1, further comprising a process for performing a development process after both of exposure of the desired pattern and exposure of the correction pattern are performed.

8. The exposure method of claim 1, further comprising a process for performing a development process for each of exposure of the desired pattern and exposure of the correction pattern.

9. An exposure mask comprising:
a mask substrate,
a mask pattern portion on which a desired pattern to be exposed on a sample is formed in an exposure region on the mask substrate and a shielding band region is formed around the desired pattern, and
a correction pattern portion on which a correction pattern corresponding to a defect of the desired pattern is formed inside the exposure region and outside the shielding band region.

10. The exposure mask of claim 9, wherein the mask pattern portion is formed by forming a pattern of an absorber film on a reflection multi-layered film after the multi-layered film is formed on the substrate, and the correction pattern portion is formed by forming a pattern of a multi-layered film at a position corresponding to a defect of the mask pattern.

11. The exposure mask of claim 10, wherein the defect is a topological defect formed in the reflection multi-layered film.

12. The exposure mask of claim 10, wherein the correction pattern portion is formed by removing a multi-layered film other than that at a position corresponding to a defect of the mask pattern after the reflection multi-layered film is formed on the substrate.

13. An exposure method comprising:
preparing a first reflection type mask on which a first pattern is uniformly repeated with a pitch twice a pitch of a pattern to be formed on a sample and a defect is formed and a second reflection type mask on which a second pattern is uniformly repeated with a pitch twice the pitch of the pattern to be formed on the sample and deviated from the pattern of the first mask by the pitch and a correction pattern of a reflection film is additionally provided at a position corresponding to a defect portion in the first reflection type mask,
performing a first pattern transfer process with respect to the sample by use of one of the first and second reflection type masks, and
performing a second pattern transfer process with respect to the sample by use of the other one of the first and second reflection type masks after the first pattern transfer process.

14. The exposure method of claim 13, wherein the first reflection type mask is formed by forming a pattern of an absorber film on the reflection multi-layered film after the reflection multi-layered film is formed on a substrate and the second reflection type mask is formed by forming a pattern of an absorber film on the reflection multi-layered film after the reflection multi-layered film is formed on the substrate and removing the absorber film at a position corresponding to the defect of the first reflection type mask.

15. The exposure method of claim 14, wherein the defect is a topological defect formed in the reflection multi-layered film.

16. The exposure method of claim 13, further comprising a process for performing a development process after both of the first pattern transfer and second pattern transfer are performed.

17. The exposure method of claim 13, further comprising a process for performing a development process for each of the first pattern transfer and second pattern transfer.

* * * * *